(12) United States Patent
Murasato et al.

(10) Patent No.: US 6,402,835 B2
(45) Date of Patent: Jun. 11, 2002

(54) PROCESS FOR PRODUCING A RAW MATERIAL POWDER TO GROW A SINGLE CRYSTAL AND THE SINGLE CRYSTAL

(75) Inventors: Masahiro Murasato, Chita; Akihiko Honda, Aichi Pref.; Katsuhiro Imai; Minoru Imaeda, both of Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/780,824

(22) Filed: Feb. 9, 2001

(30) Foreign Application Priority Data

Feb. 14, 2000 (JP) .......................... 2000-034764
Dec. 18, 2000 (JP) .......................... 2000-383098

(51) Int. Cl.⁷ ............................................ C30B 15/00
(52) U.S. Cl. ............................ 117/13; 117/81; 117/83; 252/62.9 R; 427/255
(58) Field of Search .................... 117/1, 3, 13, 937, 117/948, 81, 83; 427/255; 252/62.9 R

(56) References Cited

U.S. PATENT DOCUMENTS 5,690,734 A    11/1997   Imaeda et al. ................. 117/18

FOREIGN PATENT DOCUMENTS

EP    0 733 728 A2    9/1996
JP    8-319191         12/1996

OTHER PUBLICATIONS

B.A. Scott, et al., "The Tungsten Bronze Field in the System $K_2O–Li_2O–Nb_2O_5$," Mat. Res. Bull., vol. 5, 1970, pp. 47–56.

D.H. Yoon, et al., "Morphological Aspects of Potassium Lithium Niobate Crystals with Acicular Habit Grown by the Micro–Pulling–Down Method," Journal of Crystal Growth, 144 (1994), pp. 207–212.

Primary Examiner—Felisa Hiteshew
(74) Attorney, Agent, or Firm—Burr & Brown

(57) ABSTRACT

In a process for producing a raw material powder including lithium potassium niobate for growing a single crystal of lithium potassium niobate, raw starting materials comprising lithium carbonate powder, potassium carbonate powder and niobium pentoxide powder are mixed in a solvent. The lithium carbonate powder and potassium carbonate powder are entirely dissolved into the solvent, and lithium carbonate and potassium carbonate are then deposited around the niobium pentoxide powder by spray-drying the mixture to obtain granulated powder, and then the granulated powder is thermally treated to produce the raw material powder.

38 Claims, 1 Drawing Sheet

Figure 1:
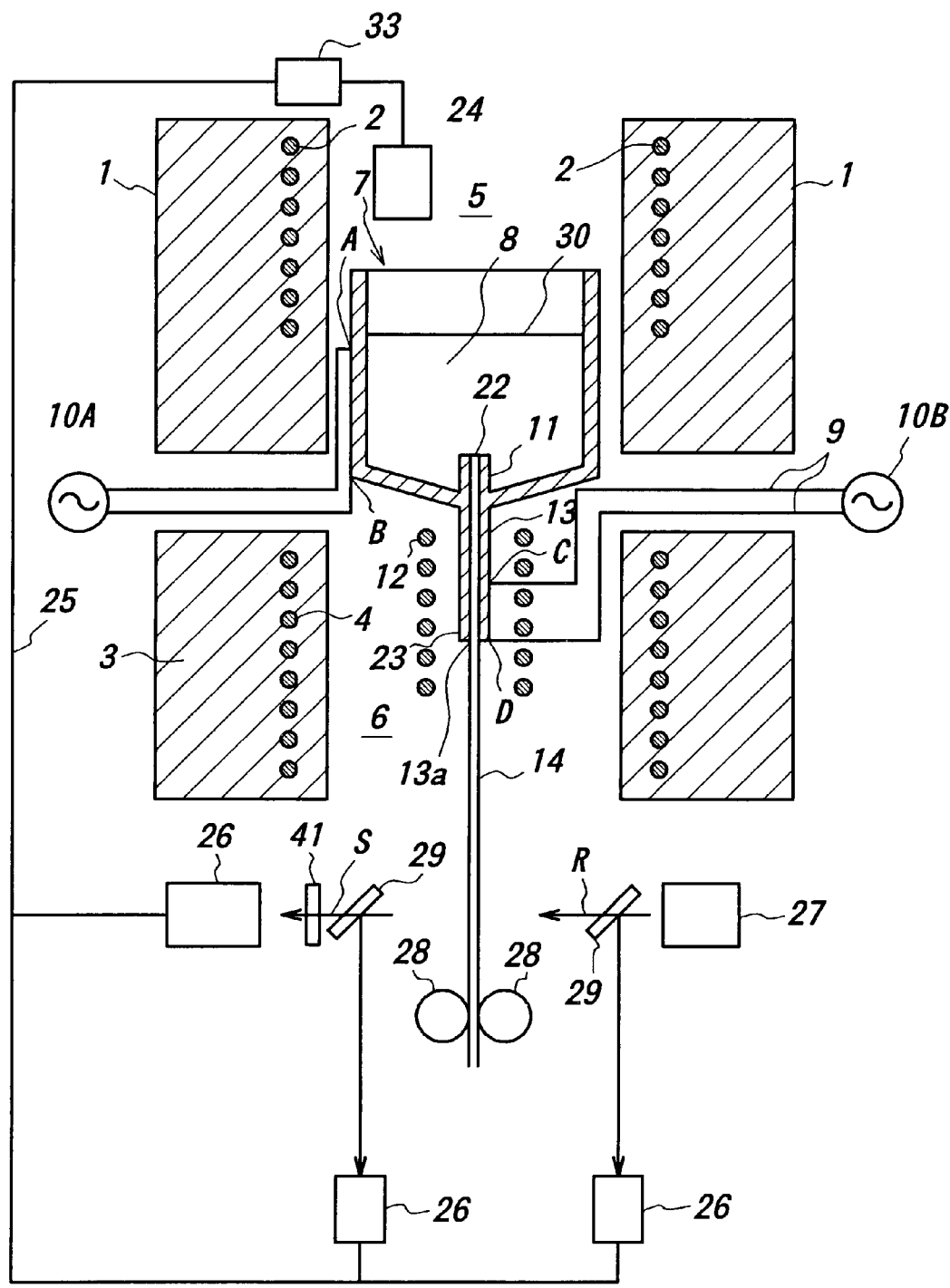

PROCESS FOR PRODUCING A RAW MATERIAL POWDER TO GROW A SINGLE CRYSTAL AND THE SINGLE CRYSTAL

BACKGROUND OF THE INVENTION

1. Field of the Invention

The invention relates to processes for producing raw material powders for growing single crystals of lithium potassium niobate or lithium potassium niobate-lithium potassium tantalate solid solution, and processes for producing the single crystals using said raw material powders.

2. Description of the Related Art

A single crystal of lithium potassium niobate and a single crystal of lithium potassium niobate-lithium potassium tantalate solid solution are remarked especially as single crystals for a blue light second harmonic generation (SHG) device for a semiconductor laser. The device can emit even ultraviolet light having wavelengths of 390 nm or so, thus the crystals can be suitable for wide applications such as for optical disk memory, medicine and photochemical fields, and various optical measurements by using such short-wavelength light. Since the above single crystals have a large electro-optic effect, they can be also applied to optical memory devices using the photo-refractive effect.

However, for an application of a second harmonic generation device, for example, even a small fluctuation in a composition of the single crystal may affect the wavelength of the second harmonic wave generated by the device. Therefore, the specification of the range of the composition required for the single crystals is severe, and the fluctuation in the composition should be suppressed in a narrow range. However, since the composition consists of as many as three or four components, growing a single crystal at a high rate is extremely difficult to achieve while controlling the proportions of the components to be constant.

NGK Insulators, Ltd. suggested a micro pulling-down method for growing the above single crystal with constant compositional proportions, for example, in JP-A-8-319191. In this method, a raw material comprising lithium potassium niobate is put into a platinum crucible and melted, and then the melt is pulled down gradually and continuously through a nozzle attached to the bottom of the crucible. An infrared irradiator and a detector are installed underneath the nozzle. Infrared rays are irradiated to the single crystal being pulled out through the nozzle, and the wavelength of the second harmonic wave oscillated from the single crystal is measured to control the composition of the single crystal constant.

Such a micro pulling-down method is useful for growing the above oxide single crystal having many components. However, for widespread uses of the above single crystal, increased industrial productivity is indispensable. For this purpose, the capacity of the crucible needs to be increased to grow as many single crystals as possible.

The inventors further examined this technique and found that, in case of mass production by enlarging the capacity of the crucible, the fluctuation in composition, development of cracks, inclusions and/or, in some cases, the formation of other nuclei, or crystalline deterioration accompanying anomalous growing rate, which hardly occurred in small-scale experiments, might be caused depending on the particle size of the raw material powder and the shape of the crucibles, which sometimes resulted in a yield loss.

SUMMARY OF THE INVENTION

An object of the invention is to prevent the fluctuation in the single crystal composition, the development of cracks or inclusions, and the crystalline deteriorations on growing a single crystal of lithium potassium niobate or a single crystal of lithium potassium niobate-lithium potassium tantalate solid solution.

A first aspect of the invention relates to a process for producing a raw material powder comprising lithium potassium niobate to grow a single crystal of lithium potassium niobate. The process comprises the steps of mixing raw starting materials comprising lithium carbonate powder, potassium carbonate powder and niobium pentoxide powder in a solvent, entirely dissolving the lithium carbonate powder and potassium carbonate powder into the solvent, then depositing lithium carbonate and potassium carbonate around the niobium pentoxide powder by spray-drying the mixture to obtain granulated powder, and thermally treating the granulated powder to produce the raw material powder.

According to the invention, a single crystal of lithium potassium niobate can also be grown by placing and melting the above raw material powder in a crucible, contacting a seed crystal against the melt, and pulling down the seed crystal from the crucible downwardly.

The invention is also related to a process for producing a raw material powder comprising lithium potassium niobate-lithium potassium tantalate solid solution to grow a single crystal of lithium potassium niobate-lithium potassium tantalate solid solution. The process comprises the steps of mixing raw starting materials comprising lithium carbonate powder, potassium carbonate powder, niobium pentoxide powder and tantalum pentoxide powder in a solvent, entirely dissolving the lithium carbonate powder and potassium carbonate powder into the solvent, then depositing lithium carbonate and potassium carbonate around said niobium pentoxide powder and said tantalum pentoxide powder by spray-drying the mixture to obtain granulated powder, and thermally treating the granulated powder to produce the raw material powder.

According to the invention, a single crystal of lithium potassium niobatelithium potassium tantalate solid solution can also be grown by placing and melting the above raw material powder in a crucible, contacting a seed crystal against the melt, and pulling down the seed crystal from the crucible downwardly.

In the first aspect of the invention, lithium carbonate and potassium carbonate depositing around the niobium pentoxide powder (and tantalum pentoxide powder, if necessary) are considered to be in fine powder forms.

The inventors found that the above fluctuation in the composition, cracks, inclusions and crystalline deteriorations were caused in accordance with the state change of the raw material powder, for example, when the capacity of the crucible was enlarged.

For example, when the raw material powder is supplied to the crucible, the raw material powder is melted and convected in the crucible, and then the melt is pulled out from the crucible. However, if the raw material powder has a heterogeneous portion, the composition becomes heterogeneous topically or temporary, which causes the fluctuation in the composition of the single crystal pulled out from the crucible. Development of cracks, inclusions or crystalline deteriorations may also occur topically depending on the fluctuation in the composition.

The existence of secondary particles in the potassium carbonate powder or the lithium carbonate powder as a raw starting material is considered as a cause of occurrence of the above heterogeneous portions in the raw material powder. Such starting material powders are hydroscopic, so that they tend to absorb moisture in air during the storage and aggregate to form the secondary coarse particles having particle diameters from 10 to 50 μm. As the secondary coarse particles cannot sufficiently react with other components in the stage of heat treatment, they remain as heterogeneous portions in the raw material powder.

It is found that the raw material powder of lithium potassium niobate or lithium potassium niobate-lithium potassium tantalate solid solution produced by the heat treatment of the above granulated powder according to the invention can substantially eliminate the above heterogeneous portions to homogenize the composition of the single crystal pulled out from the crucible and to prevent cracks, inclusions and the crystalline deteriorations.

That is, the raw material powder is obtained in such a manner that among the starting powders, the potassium carbonate powder and the lithium carbonate powder are dissolved and then deposited again on the surface of the granulated powder by spray-drying and that the granulated powder is then subjected to a heat treatment to react potassiun, lithium and niobium (and tantalum, if necessary). It is found that the obtained raw material powder is extremely well suited for growing the single crystal of the above systems.

From further examination, the inventors found that, in the step of mixing the startomg materials, even when a part of the lithium carbonate powder was only partially dissolved, the above heterogeneous portions were also substantially eliminated to homogenize the composition of the single crystal pulled out from the crucible and to prevent cracks, inclusions and the crystalline deteriorations.

That is, when the lithium carbonate powder is not entirely dissolved into the solvent in the mixing step, the dissolved lithium carbonate deposits on the niobium pentoxide power (and tantalum pentoxide powder, if necessary) in the granulation step. On the other hand, the powder undissolved in the solvent during the mixing step remains in situ in the granulated powder and, even after the heat treatment, in the raw material powder.

Herein, the inventors found that the residual secondary particle of the lithium carbonate powder having particle diameters of 10 μm or more in the raw material powder might cause the above fluctuation in the composition, cracks and inclusions. In other words, the inventors ascertained that, in this case, the above fluctuation in the composition, cracks and inclusions had their cause in the formation of the secondary particles by aggregating the lithium carbonate powder.

If such secondary particles are not substantially observed, at least at the stage of the raw material powder, the occurrences of the above fluctuation in the composition, cracks and inclusions can be prevented without dissolving the entire amount of lithium carbonate powder into the solvent.

Since potassium carbonate has a high solubility to a solvent, a small amount of the solvent can dissolve the entire amount of potassium carbonate. In contrast, since lithium carbonate has a lower solubility than that of potassium carbonate, a greater amount of the solvent is required to dissolve the entire amount of lithium carbonate. Therefore, if the throughput of the raw materials is high on dissolving the entire amount of lithium carbonate powder, a spray-drying operation will require more time and operational efficiency will be decreased. On the other hand, by dissolving a part of lithium carbonate powder, while leaving the rest undissolved in the solvent, the required amount of solvent is relatively decreased and a spray-drying operation can also be done within a shorter period of time.

At the stage of the raw material powder, the presence of secondary particles of the lithium carbonate powder having particle diameters of 10 μm or more is inspected with an electron microscope. When ten view fields of at least 80 μm×120 μm are observed with an electron microscope (1000 magnification), observing no or little (preferably one or less) secondary particles of the lithium carbonate powder having the particle diameter of 10 μm or more satisfies the above requirement.

To exclude secondary particles of the lithium carbonate powder having the particle diameters of 10 μm or more at the stage of the starting material powder, for example, the lithium carbonate powder is sorted in the dry state at the stage of measuring and preparing the starting material powder. By doing so, when secondary coarse particles exist in the lithium carbonate powder, such secondary particles are excluded so that the secondary particles of the lithium carbonate powder having particle diameters of 10 μm or more may not be included in the starting materials. Such a sorting method itself is commonly known.

Moreover, even when the secondary particles having particle diameters of 10 μm or more comprising lithium carbonate powder exist in the starting materials, such particles can be crushed on mixing. More specifically, by increasing the hardness of balls or agitating media, enhancing the agitation rate or elongating the period of agitation time in a ball mill or a media agitating mill, a condition can be set to crush the secondary particles.

The invention can be favorably applied for producing not only single crystal fibers, but also plates comprising the single crystal.

When the potassium carbonate powder and the lithium carbonate powder are entirely dissolved, the average particle diameter of each of the potassium carbonate powder and lithium carbonate powder is not particularly limited. Although the average diameter of each of the niobium pentoxide powder and the tantalum pentoxide powder is not particularly limited, it is preferably 10 μm or less from the view of acquiring the homogeneous raw material powder by a subsequent heat treatment, and preferably 0.1 μm or more from the view of easier handling.

The proportions of the constituting elements are not particularly limited as far as the single crystal can be eventually grown. However, when a single crystal of lithium potassium niobate is produced, the proportions of the lithium carbonate powder, the potassium carbonate powder and the niobium pentoxide powder are preferably 17–27 mol %, 28–32 mol % and 43–53 mol %, respectively. Moreover, when a single crystal of lithium potassium niobate-lithium potassium tantalate solid solution is produced, the proportions of the lithium carbonate powder, the potassium carbonate powder, the niobium pentoxide powder and the tantalum pentoxide powder are preferably 17–27 mol %, 28–32 mol % 38.7–52.5 mol % and 0.2–5.3 mol %, respectively.

The single crystal of lithium potassium niobate and that of lithium potassium niobate-lithium potassium tantalate solid solution may be replaced by other elements other than K, Li, Nb, Ta and O within a range of taking a tungsten bronze structure consisting of K, Li, Nb and, if necessary, Ta and O. For example, Na and Rb can substitute K and Li. In this case, the substitution rate is preferably 10 atomic % or less, when the proportion of potassium or lithium is taken as 100 atomic %. A laser-generating doping substance comprising such as Cr or a rare earth series elements of Er or Nd can also be added.

According to an embodiment of the invention, the lithium carbonate powder and the potassium carbonate powder are entirely dissolved into a solvent. In this case, whether each powder can be entirely dissolved depends on the solubility of that powder to the solvent and the volume of the solvent. Therefore, a sufficient amount of the solvent needs to be used to dissolve each powder, and adequate agitation and mixing are preferable.

The solvent is not particularly limited, but water and acids are especially preferable in that the solubilities of the potassium carbonate powder and the lithium carbonate powder thereto are high. Lithium carbonate powder has high solubilities to acids.

Also, by adding an organic binder into the solvent, potassium carbonate powder and lithium carbonate powder precipitated in water can easily attach to the surface of niobium pentoxide or tantalum pentoxide in the subsequent spray-drying. Such binders that are usable in an alkaline solution in which potassium carbonate and lithium carbonate are dissolved, acrylic binder, for example, are preferably used as the organic binder. The weight ratio of the organic binder per 100 parts by weight of the solvent is preferably 0.1–0.3 wt. %.

Such conditions as temperature, period of time and atmosphere for the heat treatment of the granulated powder are not particularly limited as far as each of the components of the granulated powder adequately react to produce the respective compounds. However, in general, the temperature is preferably 800–1,000° C. and the holding time is at least 2 hours.

FIG. 1 is a schematic sectional view of a manufacturing apparatus according to one example of the present invention for the growth of single crystals.

A crucible 7 is placed in a furnace housing. An upper furnace unit 1 is arranged to surround the crucible 7 and an upper space 5 thereof, and has a heater 2 buried therein. A nozzle 13 extends downwardly from a bottom part of the crucible 7. An opening 13a is formed at a lower end of the nozzle 13. A lower firnace unit 3 is arranged to surround the nozzle 13 and a surrounding space 6 thereof, and has a heater 4 buried therein. Such a configuration of the heating furnace itself may be obviously varied in various ways. The crucible 7 and the nozzle 13 are both formed of a corrosion-resistant conductive material.

One electrode of a power source 10A is connected to a point A of the crucible 7 with an electric cable 9, and the other electrode of the power source 10A is connected to a lower bent B of the crucible 7. One electrode of a power source 10B is connected to a point C of the nozzle 13 with the electric cable 9, and the other electrode of the power source 10B is connected to a lower end D of the nozzle 13. These current-carrying systems are isolated from each other and configured to control their voltage independently.

An after-heater 12 is further located in the space 6 to surround the nozzle 13 with a distance. An intake tube 11 extends upward in the crucible 7 and an intake opening 22 is provided at the upper end of the intake tube 11. The intake opening 22 protrudes from a bottom portion of a melt.

The upper furnace unit 1, the lower furnace unit 3 and the after-heater 12 are allowed to heat for setting an appropriate temperature distribution for each of the space 5 and space 6. Then a raw material of the melt is supplied into the crucible 7 and the electricity is supplied to the crucible 7 and the nozzle 13 for heating. In this condition, at a single crystal-growing part 23 located at the bottom end of the nozzle 13, the melt 8 slightly protrudes from the opening 13a and a relatively flat surface is formed there. A reference numeral 30 denotes the liquid level of the melt.

The gravity applied to the melt 8 in the nozzle 13 is greatly reduced due to the melt contacting against the inner surface of the nozzle 13. Especially, a uniform solid phase-liquid phase interface can be formed by setting the internal diameter of the nozzle 13 to 0.5 mm or less.

In this condition, a seed crystal is moved upward and the end face of the seed crystal is contacted with the surface of the melt. Then, the seed crystal is pulled downward. Hereupon, a uniform solid phase-liquid phase interface (meniscus) is formed between the upper end of the seed crystal and the melt being pulled out from the nozzle.

As a result, a single crystal fiber 14 is continuously formed on the upper side of the seed crystal and pulled downward. According to this embodiment, a roller 28, which is a drive unit, carries the single crystal fiber 14.

When the single crystal is continuously pulled out downwardly, a laser beam having a wavelength of near $2\lambda_0$ is radiated from a laser source 27 to the single crystal 14 as shown by an arrow R in FIG. 1 indicating, and a output light S from the single crystal having a wavelength of near a second harmonic wave$\lambda_0$ is received by a light-receiving unit 26 through a long wavelength cut filter 41 to detect the intensity thereof A signal from the light-receiving unit 26 is transmitted to a control unit 33 through a signal line 25, wherein the signal is processed. When the measured intensity of the output light deviates from a predetermined value, the control unit transmits a certain signal to a raw material supplying apparatus 24 as a feedback. In this case, a raw material powder having a slightly different composition from the raw material powder first placed into the crucible may be further added into the crucible.

For more accurate control, a part of the long wavelength light of near $2\lambda_0$ is measured by a combination of a reflecting mirror 29 and the light-receiving unit 26, and the resulting signal is transmitted to the control apparatus 33 through the signal line 25.

A single crystal plate can be formed by changing the shape of the nozzle 13.

Hereafter, further detailed experimental results are described.

EXAMPLE 1

A single crystal manufacturing apparatus as shown in FIG. 1 was used to produce a single crystal plate of lithium potassium niobate according to the invention.

Lithium carbonate powder, potassium carbonate powder and niobium pentoxide powder were weighed to give a ratio of 19 mol %: 30 mol %: 51 mol % as calculated in molar ratio of lithium atoms, potassium atoms and niobium atoms, respectively, and then each powder was added to water. In this case, the weight ratio of water and the starting materials was set to 6:1 to completely dissolve the lithium carbonate powder and the potassium carbonate powder into water. Then, 0.3 parts by weight of an acrylic binder was added per 100 parts by weight of water. Each powder was crushed in a pot mill for 15 hours, then mixed and slurry was obtained. The slurry was treated by a spray-dryer to make granulated powder.

A differential thermal analysis on a portion taken from this granulated powder showed the reaction temperature of 690° C. Then, the granulated powder was subjected to the heat treatment in an electric furnace at 900° C. for 4 hours to give an intended raw material powder. An electron microscope analysis on a portion taken from this raw material power showed that the average particle diameter of the powder was about 5 μm and no secondary coarse particles having particle diameters of 10 μm or more could be observed. A chemical composition analysis on randomly selected particles by using an X-ray analyzer attached to the electron microscope showed that such particles gave almost the same analyzed values. Thus, it was suggested that lithium carbonate and potassium carbonate precipitated around the niobium pentoxide particles.

Then, 0.1 g of the above raw material powder was charged into a platinum crucible which was preliminarily filled with a molten single crystal of lithium potassium niobate, and its melted state was examined. As a result, the powder started melting at 1050° C. and entirely melted at 1050° C. Also, a chemical composition analysis on a portion taken from the above raw material by an inductively coupled plasma method and an X-ray fluorescence method showed that a ratio of lithium, potassium and niobium were 19 mol %: 30 mol %: 51 mol %, respectively within a range of errors by these measuring methods (the ratio agreed with the formulated composition of the above raw materials).

A single crystal plate was formed by the micro pulling-down method with the above raw material powder and the apparatus previously described referring to FIG. 1. Specifically, the temperature of whole furnace was controlled by the upper furnace unit 1 and the lower furnace unit 3. The apparatus was configured to control a temperature gradient near a single crystal-growing part 23 by the electric power supply for a nozzle 13 and the heat generation of an after-heater 12. A single crystal pulling-down mechanism was mounted to pull down the single crystalline plate in vertical direction, while controlling the pulling-down velocity evenly within a range from 2 to 100 mm/hour.

Then, a growth-initiating raw material was prepared in the same manner as the above raw material powder except that the first mixture ratio was adjusted to 25:30:45 for lithium, potassium and niobium, respectively, in the growth-initiating raw material powder. The growth-initiating raw material powder was filled in a platinum crucible 7, and then the crucible 7 was located in place. The temperature of a space 5 in an upper furnace unit was adjusted to a range from 1100 to 1200° C. to melt the raw materials in the crucible 7. The temperature of a space 6 in a lower furnace unit 3 was controlled evenly within 500–1000° C. Predetermined electricity was supplied to the crucible 7, the nozzle 13 and the after-heater 12 to grow single crystals. In this case, the temperature of the single crystal-growing part could be 980–1150° C. and the temperature gradient at the single crystal growing part could be controlled to 10–150° C./mm.

The size of an opening of the nozzle 13 was set to 1 mm×50 mm, and the length of the nozzle was set to 10 mm. The plane shape of the crucible 7 was of an elliptical shape with a major axis of 50 mm, a minor axis of 10 mm and a height of 10 mm. In this condition, a single crystal plate having a rectangular cross section (30 mm×1 mm) was pulled down at a rate of 20 mm/hour.

The raw material powder was continuously fed from a raw material feeder 24 to the crucible 7 at a rate of 2.66 g/hour, while the single crystal was growing. The fed raw material powder was immediately melted in whole, and fluctuation in the composition, cracks or inclusions which would be caused by melting residue of the raw material powder or varied melting rates did not occur. In addition, compositions of various parts of the single crystal grown were evaluated by the c axis length of the crystal lattice to give the ratio of 19 mol %:30 mol %:51 mol % for lithium, potassium and niobium, respectively, which agreed with the composition of the raw material powder.

Comparative Example 1

A granulated powder was made in the same manner as in Example 1. However, unlike Example 1, since water and the raw starting material were mixed at a weight ratio of 6:4, the whole amount of potassium carbonate powder was dissolved after mixing, but lithium carbonate powder was partly undissolved to remain as residue in the water.

A differential thermal analysis on a portion taken from the acquired granulated powder showed the reaction temperature of 690° C. The granulated powder was also subjected to the heat treatment according to Example 1 to give a raw material powder. An electron microscope analysis on the raw material powder showed the presence of secondary particles of lithium carbonate having the diameter of at least 50 μm. The melting state of the raw material powder was examined according to Example 1. The raw material powder started melting at 1050° C. and entirely melted at 1050° C. A chemical composition analysis on the raw material powder according to Example 1 also showed the ratio of 17 mol %:31 mol %:52 mol % for lithium, potassium and niobium, respectively, which was lacking in lithium as compared to the composition of the mixture.

A single crystal plate was formed according to Example 1 by using the raw material powder. The raw material powder being fed to the crucible immediately melted in whole, and fluctuation in the composition or cracks which would be caused by the melting residue of the raw material powder did not occur. In addition, compositions of the single crystal after the growing were evaluated by the c axis length of the crystal lattice to give the ratio of 17 mol %:30 mol %:53 mol % for lithium, potassium and niobium, respectively.

Comparative Example 2

Starting materials were weighed according to Example 1. Ethanol was used as a solvent. Ethanol and the starting materials were mixed at a ratio of 6:4. The starting materials were insoluble to ethanol. The starting materials and ethanol were crushed in a pot mill for 15 hours, then mixed and slurry was obtained. The slurry was put into a vat and dried in a fan dryer at 180° C. for 8 hours to produce granulated powder.

A differential thermal analysis on a portion taken from the granulated powder showed the reaction temperature of 790° C.

Then, the granulated powder was subjected to the heat treatment according to Example 1 to give a raw material powder. An electron microscope analysis on the raw material powder showed the presence of secondary particles of potassium carbonate having the particle diameter of 100 μm or more. The melted state of the raw material powder was also examined according to Example 1. The raw material powder started melting at 950° C. and entirely melted at 1200° C. A chemical composition analysis on the raw material powder according to Example 1 also showed that the composition of the powder agreed with the prepared composition within a range of errors by these measuring methods.

A single crystal plate was formed according to Example 1 by using the above raw material powder. The fed raw material powder was not completely melted, and fluctuation in the composition or cracks which would be caused by the melting residue of the raw material powder occurred.

EXAMPLE 2

Lithium carbonate powder, potassium carbonate powder and niobium pentoxide powder were weighed according to Example 1, except that the lithium carbonate powder was sorted in the dry state and did not include the secondary particles of 10 μm or more. Starting materials were mixed according to Example 1, except that the weight ratio of water and the starting materials was 6:4. The whole amount of the potassium carbonate powder was dissolved into water after mixing, but the lithium carbonate powder was partly dissolved and the rest remained as a residue in the water. Then, an acrylic binder was added to the water to give slurry via crushing and mixing. The slurry was spray-dried to produce granulated powder.

A differential thermal analysis according to Example 1 on a portion taken from the granulated powder showed the reaction temperature of 690° C.

Then, the granulated powder was subjected to the heat treatment in an electric furnace at 900° C. for 4 hours to give an intended raw material powder. An electron microscope analysis on a portion taken from this raw material power showed that the average diameter of the powder was about 5 μm and no secondary coarse particles having particle diameters of 10 μm or more could be observed. A chemical composition analysis on randomly selected particles by using an X-ray analyzer attached to the electron microscope showed that such particles gave almost the same analyzed values. Thus, it was suggested that lithium carbonate and potassium carbonate precipitated around the niobium pentoxide particles.

The melted state of the raw material powder was also examined according to Example 1. As a result, the powder started melting at 1050° C. and entirely melted at 1050° C. Also, a chemical composition analysis on a portion taken from the raw material by an inductively coupled plasma method and an X-ray fluorescence method showed the same results as in Example 1.

A single crystal plate was formed by the micro pulling-down method with the above raw material powder according to Example 1. As a result, a single crystal plate without any fluctuation in composition, cracks or inclusions could be obtained. Compositions of various parts of the single crystal plate were evaluated by the c axis length of the crystal lattice to give the composition ratio of lithium, potassium and niobium agreed with the composition of the raw material powder.

As described hereinabove, according to the invention, when a single crystal of lithium potassium niobate or lithium potassium niobatelithium potassium tantalate solid solution are grown, fluctuation in composition of the single crystal, cracks, inclusions and deterioration of crystallinity can be prevented.

What is claimed is:

1. A process for producing a raw material powder comprising lithium potassium niobate to grow a single crystal of lithium potassium niobate, said process comprising the steps of mixing starting raw materials comprising a lithium carbonate powder, a potassium carbonate powder and a niobium pentoxide powder in a solvent, entirely dissolving the lithium carbonate powder and the potassium carbonate powder into the solvent, then depositing lithium carbonate and potassium carbonate around said niobium pentoxide powder by spray-drying the mixture to obtain granulated powder, and thermally treating the granulated powder to produce said raw material powder.

2. A process for producing a raw material powder according to claim 1, wherein an organic binder is included in said solvent.

3. A process for producing a raw material powder according to claim 2, wherein said solvent is water.

4. A process for producing a raw material powder according to claim 1, wherein said solvent is water.

5. A process for producing a raw material powder comprising lithium potassium niobate to grow a single crystal of lithium potassium niobate, said process comprising the steps of mixing starting raw materials comprising a lithium carbonate powder, a potassium carbonate powder and a niobium pentoxide powder in a solvent, dissolving all of the potassium carbonate powder and a part of the lithium carbonate powder into the solvent, then depositing lithium carbonate and potassium carbonate around said niobium pentoxide powder by spray-drying the mixture to obtain granulated powder, and thermally treating the granulated powder to produce said raw material powder, wherein secondary particles are substantially excluded from said raw material powder.

6. A process for producing a raw material powder according to claim 5, wherein secondary particles of said lithium carbonate powder having particle diameters of 10 mm or more are excluded from said starting raw materials by sorting said lithium carbonate powder in a dry state.

7. A process for producing a raw material powder according to claim 6, wherein an organic binder is included in said solvent.

8. A process for producing a raw material powder according to claim 7, wherein said solvent is water.

9. A process for producing a raw material powder according to claim 6, wherein said solvent is water.

10. A process for producing a raw material powder according to claim 5, wherein secondary particles of lithium carbonate powder having particle diameters of 10 mm or more are crushed in the step of mixing.

11. A process for producing a raw material powder according to claim 10, wherein an organic binder is included in said solvent.

12. A process for producing a raw material powder according to claim 11, wherein said solvent is water.

13. A process for producing a raw material powder according to claim 10, wherein said solvent is water.

14. A process for producing a raw material powder comprising lithium potassium niobate-lithium potassium tantalate solid solution to grow a single crystal of lithium potassium niobate-lithium potassium tantalate solid solution, said process comprising the steps of mixing starting raw materials comprising a lithium carbonate powder, a potassium carbonate powder, a niobium pentoxide powder and tantalum pentoxide powder in a solvent, entirely dissolving the lithium carbonate powder and the potassium carbonate powder into said solvent, then depositing lithium carbonate and potassium carbonate around said niobium pentoxide powder and said tantalum pentoxide powder by spray-drying the mixture to obtain granulated powder, and thermally treating the granulated powder to produce said raw material powder.

15. A process for producing a raw material powder comprising lithium potassium niobate-lithium potassium tantalate solid solution to grow a single crystal of lithium potassium niobate-lithium potassium tantalate solid solution, said process comprising the steps of mixing starting raw materials comprising a lithium carbonate powder, a potassium carbonate powder, a niobium pentoxide powder and a tantalum pentoxide powder in a solvent, dissolving all of the potassium carbonate powder and a part of the lithium carbonate powder into said solvent, then depositing lithium carbonate and potassium carbonate around said niobium pentoxide powder and said tantalum pentoxide powder by spray-drying the mixture to obtain granulated powder, and thermally treating the granulated powder to produce said raw material powder, wherein secondary particles are substantially excluded from said raw material powder.

16. A process for producing a raw material powder according to claim 15, wherein secondary particles of said lithium carbonate powder having particle diameters of 10 $\mu$m or more are excluded from said starting raw materials by sorting said lithium carbonate powder in a dry state.

17. A process for producing a raw material powder according to claim 15, wherein secondary particles of lithium carbonate powder having particle diameters of 10 $\mu$m or more are crushed in the step of mixing.

18. A process for producing a raw material powder according to claim 15, wherein an organic binder is included in said solvent.

19. A process for producing a raw material powder according to claim 15, wherein said solvent is water.

20. A process for producing a single crystal of lithium potassium niobate, said process comprising the steps of mixing starting raw materials comprising a lithium carbonate powder, a potassium carbonate powder and a niobium pentoxide powder in a solvent, entirely dissolving the lithium carbonate powder and the potassium carbonate powder into said solvent, then depositing lithium carbonate and potassium carbonate around said niobium pentoxide powder by spray-drying the mixture to obtain granulated powder, thermally treating the granulated powder to produce a raw material powder comprising lithium potassium niobate, then placing the raw material powder in a crucible, melting the powder, contacting a seed crystal against the melt, and growing a single crystal of lithium potassium niobate by pulling down the seed crystal from the crucible downwardly.

21. A process for producing a single crystal according to claim 20, wherein an organic binder is included in said solvent.

22. A process for producing a single crystal according to claim 21, wherein said solvent is water.

23. A process for producing a single crystal according to claim 20, wherein said solvent is water.

24. A process for producing a single crystal of lithium potassium niobate, said process comprising the steps of mixing starting raw materials comprising a lithium carbonate powder, a potassium carbonate powder and a niobium pentoxide powder in a solvent, dissolving all of said potassium carbonate powder and a part of said lithium carbonate powder into said solvent, then depositing lithium carbonate and potassium carbonate around said niobium pentoxide powder by spray-drying the mixture to obtain granulated powder, thermally treating the granulated powder to produce a raw material powder comprising lithium potassium niobate, substantially excluding secondary particles of the lithium carbonate powder from the raw material powder, then placing the raw material powder in a crucible, melting the powder, contacting a seed crystal against the melt, and growing a single crystal of lithium potassium niobate by pulling down the seed crystal from the crucible downwardly.

25. A process for producing a single crystal according to claim 24, wherein the secondary particles of the lithium carbonate powder having particle diameters of 10 mm or more are excluded from said starting raw materials by sorting said lithium carbonate powder in a dry state.

26. A process for producing a single crystal according to claim 25, wherein an organic binder is included in said solvent.

27. A process for producing a single crystal according to claim 26, wherein said solvent is water.

28. A process for producing a single crystal according to claim 25, wherein said solvent is water.

29. A process for producing a single crystal according to claim 24, wherein the secondary particles of lithium carbonate having particle diameters of 10 mm or more are crushed in the step of mixing.

30. A process for producing a single crystal according to claim 29, wherein an organic binder is included in said solvent.

31. A process for producing a single crystal according to claim 30, in said solvent is water.

32. A process for producing a single crystal according to claim 29, wherein said solvent is water.

33. A process for producing a single crystal of lithium potassium niobate-lithium potassium tantalate solid solution, said process comprising the steps of mixing starting materials comprising a lithium carbonate powder, a potassium carbonate powder, a niobium pentoxide powder and a tantalum pentoxide powder in a solvent, entirely dissolving said lithium carbonate powder and said potassium carbonate powder into said solvent, then depositing lithium carbonate and potassium carbonate around said niobium pentoxide powder and said tantalum pentoxide powder by spray-drying the mixture to obtain a granulated powder, thermally treating the granulated to produce a raw material powder comprising lithium potassium niobate-lithium potassium tantalate solid solution, then placing the raw material powder in a crucible, melting the powder, contacting a seed crystal against the melt, and growing a single crystal of lithium potassium niobate-lithium potassium tantalate solid solution by pulling down the seed crystal from the crucible downwardly.

34. A process for producing a single crystal of lithium potassium niobate-lithium potassium tantalate solid solution, said process comprising the steps of mixing starting materials comprising a lithium carbonate powder, a potassium carbonate powder, a niobium pentoxide powder and a tantalum pentoxide powder in a solvent, dissolving all of said potassium carbonate powder and a part of said lithium carbonate powder into said solvent, then depositing lithium carbonate and potassium carbonate around said niobium pentoxide powder and said tantalum pentoxide powder by spray-drying the mixture to obtain a granulated powder, thermally treating the granulated powder to produce a raw material powder comprising lithium potassium niobate-lithium potassium tantalate solid solution, substantially excluding secondary particles of the lithium carbonate powder, then placing the raw material powder in a crucible, melting the powder, contacting a seed crystal against the melt, and growing a single crystal of lithium potassium niobate-lithium potassium tantalate solid solution by pulling down the seed crystal from the crucible downwardly.

35. A process for producing a single crystal according to claim 34, wherein the secondary particles of the lithium carbonate powder having particle diameters of 10 $\mu$m or more are excluded from said starting raw materials by sorting said lithium carbonate powder in a dry state.

36. A process for producing a single crystal according to claim 34, wherein the secondary particles of lithium carbonate having particle diameter of 10 $\mu$m or more are crushed in the step of mixing.

37. A process for producing a single crystal according to claim 34, wherein an organic binder is included in said solvent.

38. A process for producing a single crystal according to claim 34, wherein said solvent is water.

* * * * *